United States Patent [19]

Hanna

[11] 4,042,886
[45] Aug. 16, 1977

[54] HIGH INPUT IMPEDANCE AMPLIFIER CIRCUIT HAVING TEMPERATURE STABLE QUIESCENT OPERATING LEVELS

[75] Inventor: John Edward Hanna, Scottsdale, Ariz.

[73] Assignee: Motorola, Inc., Chicago, Ill.

[21] Appl. No.: 605,492

[22] Filed: Aug. 18, 1975

[51] Int. Cl.$^2$ ............................................. H03F 3/45
[52] U.S. Cl. ....................................... 330/23; 330/25; 330/30 D
[58] Field of Search ................... 330/23, 26, 30 D, 69, 330/25, 28

[56] References Cited

U.S. PATENT DOCUMENTS

| | | | |
|---|---|---|---|
| 2,852,625 | 9/1958 | Nunt | 330/26 X |
| 3,188,576 | 6/1965 | Lewis | 330/23 |
| 3,526,847 | 9/1970 | Campbell | 330/30 D X |
| 3,800,239 | 3/1974 | Callahan | 307/299 B X |
| 3,914,704 | 10/1975 | Craft | 330/30 D X |

*Primary Examiner*—James B. Mullins
*Attorney, Agent, or Firm*—Maurice J. Jones, Jr.

[57] ABSTRACT

An amplifier configuration is disclosed which utilizes a resistive, positive feedback network to develop a high input impedance. The amplifier, which is suitable for manufacture in monolithic integrated circuit form, includes a pair of differential transistors which are coupled to a current supply that provides a current having a predetermined temperature coefficient. A resistor, which is connected between the emitters of the differential transistors, develops either a temperature stable offset voltage or an offset voltage having a desired temperature coefficient in response to the current. A negative feedback circuit facilitates control of the bias voltages for the pair of differential transistors. Temperature stable quiescent input and output voltage levels are derived from the offset voltage through the feedback network.

16 Claims, 2 Drawing Figures

HIGH INPUT IMPEDANCE AMPLIFIER CIRCUIT HAVING TEMPERATURE STABLE QUIESCENT OPERATING LEVELS

BACKGROUND OF THE INVENTION

Many applications exist in present day electronic equipment for bipolar amplifier circuits having high input impedances. More specifically, it is desirable to use such amplifiers with high impedance, ceramic transducers to provide maximum power transfer between the transducer and the amplifier and to satisfy frequency response specifications. Unfortunately, bipolar transistors and their associated biasing networks do not normally provide a high enough input impedance for such applications.

Positive feedback techniques have been utilized in bipolar amplifiers to increase the apparent input impedance thereof by a technique referred to in the art as "boot-strapping". Circuits utilizing discrete components normally include bootstrap capacitors for applying positive feedback from the amplifier output terminal, to the amplifier input terminal. These capacitors tend to increase the cost of the prior art discrete circuits. Furthermore, such circuit configurations are not suitable for fabrication in monolithic form. This is because the required amount of capacitance of the bootstrap feedback capacitor is greater than the amount of capacitance which can be readily and inexpensively provided on a monolithic integrated circuit chip. As a result, if the discrete circuit configuration was fabricated in monolithic form, the bootstrap capacitor would have to be provided external to the monolithic chip. Hence, leads or pins would have to be brought from the chip to connect to the capacitor which would undesirably increase the size of the integrated circuit and prevent these pins from being available for other functions.

Accordingly, prior art circuits have been developed which eliminate the need for the bootstrap capacitor. These circuits however suffer from other shortcomings when provided in integrated circuit form. More specifically, these other prior art circuits sometimes have quiescent operating voltages which depend on the somewhat unpredictable betas of PNP transistors, the degree of matching between current sources and have large undesired temperature caused variations. Also these prior art circuits often require large frequency compensation capacitors for preventing internal oscillation. As a result, the quiescent operating points of individual circuits tend to vary even at constant temperatures between different batches of wafers because of normally uncontrolled processing parameters. Because of signal drifts with temperature and variations with processing parameters, it is difficult to rapidly test the resulting amplifier circuits which increases their cost. Moreover, it is difficult to design circuits that can be direct current (DC) coupled to the output terminals of such amplifiers because the quiescent output voltage of such amplifiers are not constant. Also, such prior art circuits are often unnecessarily complex.

BRIEF SUMMARY OF THE INVENTION

An object of the invention is to provide simple and inexpensive amplifier circuits.

Another object is to provide amplifier circuit configurations which are suitable for being economically manufactured in integrated circuit form.

Still another object of the invention to provide amplifier circuits which have high dynamic input impedances and which include resistive and bipolar semiconductor devices but which do not require bootstrap feedback capacitors.

A further object of this invention is to provide monolithic amplifier circuit configurations that generate quiescent voltages that remain substantially constant with temperature change.

A still further object of the invention is to provide amplifier configurations suitable for manufacture in integrated circuit form which provide quiescent voltages that remain predictable even between different batches of integrated circuits made by processes with slightly differing process parameters.

An additional object of the invention to provide amplifier circuit configurations wherein the frequency compensating capacitor is manufactured as part of a monolithic integrated circuit structure so that an external, discrete, frequency compensation capacitor and pinouts therefor are not necessary.

The high input impedance amplifier includes first and second differentially connected electron control devices. A circuit means for developing a predetermined potential difference having a selected temperature coefficient is coupled between first main electrodes of the differentially connected electron control devices. A differential-to-single ended converter is connected between the second main electrodes of the differential electron control devices and arranged to minimize the effects of PNP beta variation between different wafers. A current amplifier is connected between the output terminal of the differential-to-single ended converter and the output terminal of the high input impedance amplifier. A resistive network couples the control electrode of one of the differentially connected electron control device to the output terminal of the current amplifier and a bias resistor is connected between the resistive network and the control electrode of the other of the differentially connected electron control devices.

Negative feedback is provided through the resistive network to control the bias voltages of the differentially connected electron control devices. Positive feedback is provided through the bias resistor for increasing the input impedance at the control electrode of the other of the differentially connected electron control devices. Temperature stable quiescent amplifier input and output voltage levels are derived from the predetermined potential difference by the bias resistor and the resistive feedback network. Furthermore, the amplifier configuration enables Miller multiplication of the capacitance of the frequency stabilizing capacitor connected between the control and second main electrodes of one of the differential electron control devices.

DETAILED DESCRIPTION OF A PREFERRED EMBODIMENT OF THE INVENTION

Figure 1:
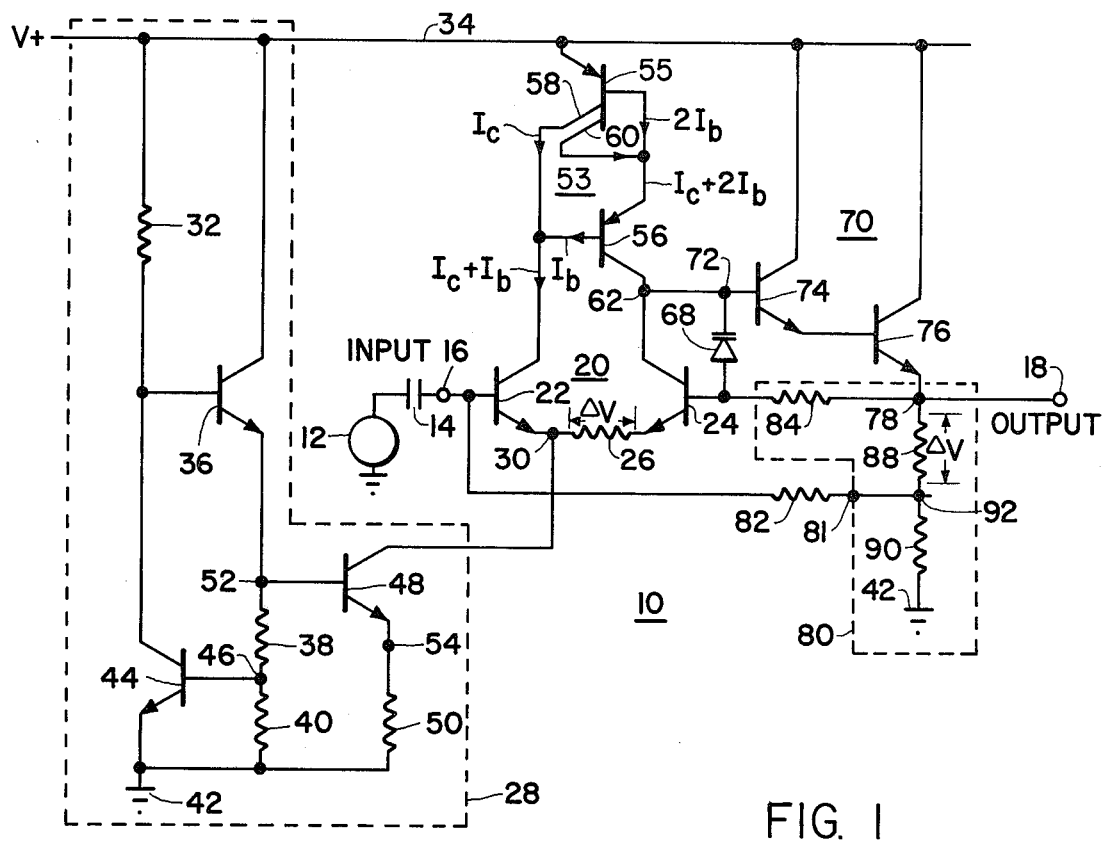
FIG. 1 is a schematic diagram of an amplifier circuit in accordance with one embodiment of the invention.

FIG. 1 is a schematic diagram of amplifier 10 of one embodiment of the invention which is suitable for amplifying an input signal, applied by signal source 12 through coupling capacitor 14 to input terminal 16, to provide an output signal at amplifier output terminal 18. Since amplifier 10 provides a high input impedance at input terminal 16, it is suitable for amplifying signals provided by a ceramic or other high impedance transducer. Moreover, since amplifier 10 can provide a quiescent voltage level at input terminal 16 and output terminal 18 which either does not vary substantially with temperature change or has a selected temperature coefficient, these terminals can be readily direct coupled to other circuits. Although the configuration of amplifier 10 is suitable for manufacture in monolithic integrated circuit form, it can also be provided by discrete components. Amplifier circuit 10 has particular utility in audio frequency applications, as a preamplifier for instance.

A differential amplifier 20 having differentially connected NPN bipolar transistors 22 and 24 is included in amplifier 10. The first main or emitter electrodes of transistors 22 and 24 are coupled together through resistor or circuit means 26. Current source or supply 28, which provides a current having a magnitude that changes in a predetermined manner with temperature variation, is coupled to circuit node 30 between the emitter electrode of transistor 22 and one end of resistor 26. Current source 28 includes resistor 32 which is connected between positive power supply conductor 34 and the base or control electrode of transistor 36. The collector or second main electrode of transistor 36 is also connected to power supply conductor 34. A resistive voltage divider including resistors 38 and 40 is connected between the emitter of NPN transistor 36 and the negative potential or ground power supply conductor 42. The base electrode of transistor 44 is connected to node 46 between resistors 38 and 40. Transistor 44 has a collector electrode which is connected to the base electrode of transistor 36 and an emitter electrode which is connected to power supply conductor 42. Transistor 48 includes a collector electrode which is connected to mode 30, a base electrode which is connected to the emitter electrode of transistor 36 and an emitter electrode which is coupled through resistor 50 to reference potential conductor 42.

A differential-to-single ended converter circuit 53 formed by multiple collector PNP transistor 55 and PNP transistor 56, is connected between the collector electrodes of differential transistors 22 and 24 and power supply conductor 34. More specifically, the emitter electrode of transistor 55 is connected to positive power supply conductor 34. Collector electrode 58 of transistor 55 is connected to the collector electrode of differential transistor 22 and to the base electrode of transistor 56. Collector electrode 60 of transistor 55 is connected to the emitter electrode of transistor 56 and to the base electrode of transistor 55. The collector electrode of transistor 56 is connected to differential amplifier output terminal 62 and to the collector electrode of transistor 24. Differential-to-single ended converter circuit 53 converts differential current signals occurring between the collector electrodes of transistors 22 and 24 into a "single ended" current signal, which is developed at amplifier output terminal 62. Frequency compensation capacitor 68 coupled differential amplifier output terminal 62 to the base electrode of transistor 24.

Current amplifier 70, which includes Darlington connected transistors 74 and 76, has an input terminal 72 between differential amplifier output terminal 62 and the base electrode of first Darlington connected transistor 74. The emitter electrode of transistor 74 is connected to the base electrode of transistor 76 and the collector electrodes of transistors 74 and 76 are both connected to power supply conductor 34. The emitter electrode of second Darlington connected transistor 76 is connected to output terminal 78 of current amplifier 70.

Resistive feedback network 80 is coupled to the base electrode of transistor 24, current amplifier output terminal 78, terminal 81 of bias resistor 82 and negative power supply conductor 42. More specifically, resistor 84 is connected between the base electrode of differential transistor 24 and current amplifier output terminal 78; resistor 88 is connected between current amplifier output terminal 78 and terminal 81 of bias resistor 90 is connected between terminal 81 of resistor and the negative supply conductor. Bias resistor 82 is connected from circuit node 81 between resistors 88 and 90 to amplifier input terminal 16.

QUIESCENT OPERATION

Figure 2:
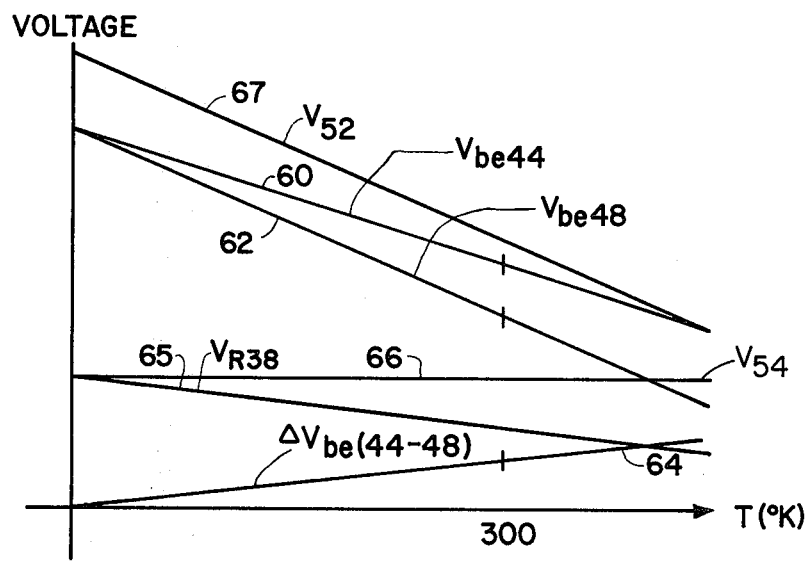
FIG. 2 is a graph indicating the relationship between temperature and voltages within the current source or supply of the circuit of FIG. 1.

The operation of current supply or source 28 is described next. Transistor 36 is rendered conductive by current from positive voltage supply conductor 34 which flows through resistor 32. The emitter current of transistor 36 flows to negative power supply conductor 42 through resistors 38 and 40. The resulting voltage across resistor 40 causes transistor 44 to conduct a current on the order of between 1 to 2 MA. The base-to-emitter voltage of transistor 44 decreases with temperature increase as illustrated by line 60 of FIG. 2. The slope of line 60 is the temperature coefficient of the base-to-emitter voltage of transistor 44. The voltage developed across the series combination of resistors 38 and 40 causes transistor 48 to conduct a current on the order of from between 10 and 20 micro amps. Hence, transistor 44 conducts about 100 times as much current as transistor 48. The decrease in base-to-emitter voltage of transistor 48 with temperture increase in illustrated by line 62 of FIG. 2. The base-to-emitter voltage of transistor 48 decreases more rapidly with temperature increase than the base-to-emitter voltage of transistor 44 because transistor 48 conducts less current than transistor 44. More specifically, the negative temperature coefficient or slope of line 62 of transistor 48 maybe about −2 millivolts per ° C and the negative temperature coefficient or slope of line 60 of transistor 44 may be approximately equal to −1.6 millivolts per ° C. Thus, the difference in base-to-emitter voltages has a positive temperature coefficient of approximately 0.4 mV/° C as illustrated by line 64 of FIG. 2.

Transistors 44 and 36 operate as a feedback amplifier to provide a voltage at node 52 having a temperature coefficient equal to a multiple of the temperature coefficient of the base-to-emitter voltage of transistor 48. The base-to-emitter voltage of transistor 44, which is developed across resistor 40, is the temperature dependant input signal to the feedback amplifier. Resistor 38 provides the feedback path from output terminal 52 of the feedback amplifier. Transistor 36 provides a low output impedance with respect to terminal 52. The ratios of resistors 38 and 40 are chosen so that the temperature coefficient of the voltage across resistor 38, shown by line 65, equals the difference in the temperature coefficients between transistors 44 and 48 so that the voltage at terminal 52 has the same temperature coefficient as the base-to-emitter voltage of transistor 48. Hence, the input voltage of transistor 48, V52 shown as line 67 decreases in magnitude equally with the magnitude of the base-to-emitter voltage of transistor 48. Therefore, the voltage at terminal 54 has a constant magnitude with temperature variation, as illustrated by line 66 of FIG. 2. Alternatively, the ratios of resistors 38 and 40 could be chosen to cause the voltage at terminal 54 to have a predetermined temperature coefficient.

The resistance of monolithic resistor 50 has a temperature coefficient which may be on the order of a positive 2,000 parts per million per degree centigrade. Thus as the temperature increases, the resistance of resistor 50 increases at a predetermined rate thereby decreasing the emitter current and thus the collector current of transistor 48. The collector current of transistor 48, which is the outut current of supply 28, divides equally between one path including the emitter of transistor 22 and another path including resistor 26 and the emitter of transistor 24. Monolithic resistor 26 and 50 are constructed in a known manner to have closely matched resistive temperature coefficients. Therefore, as the temperature increases the resistance of resistor 26 also increases at the rate of about 2,000 parts per million per degree Centigrade. Since the magnitude of the current through resistor 26 is changing at the same rate but in the opposite direction as the change in resistance of resistor 26, the decrease in current from transistor 48 is balanced by the increase in resistance of resistor 26. Thus, a predetermined voltage, $\Delta V$ is developed across resistor 26 which has a magnitude that remains constant even though the temperature varies. Alternatively, if the voltage at terminal 54 has been designed to have a predetermined temperature coefficient, the voltage $\Delta V$ would also have the same predetermined temperature coefficient, which could be either positive or negative.

Differential-to-single ended voltage converter 53 is designed to cause the temperature stable potential difference $\Delta V$ to be predictable between different batches of wafers by ensuring that transistors 22 and 24 have equal currents. More specifically, as previously mentioned, the variations of the betas of PNP transistors between batches of wafers has tended to result in unpredictable quiescent output voltages in prior art monolithic amplfiers. PNP transistors 55 and 56 of turn around circuit 53 are configured and connected to cause the collector currents and hence the emitter currents of transistors 22 and 24 to be substantially balanced.

Current $I_c$ flows from each of collectors 58 and 60 of transistor 55. A current of two $I_b$ flows from the base elctrode of transistor 55. Thus, a current having a magnitude equal to $I_c + 2I_b$ flows into the emitter electrode of transistor 56 and a current of approximately $I_b$ flows out of the base electrode of transistor 56. Consequently, the collector current of transistor 22 is equal to $I_c + I_b$. Furthermore, the collector current of transistor 24 tends to also be substantially equal to $I_c + I_b$ because current amplifier 70 only draws a small amount of current during quiescent operation. The matching of currents $I_c + I_b$ provided by PNP lateral transistor 55 and 56 are substantially independent of the betas of transistors 55 and 56.

The small current flowing into the base of transistor 74 appears at the emitter of transistor 76 multiplied by the dc current gains of both transisors 74 and 76. This output emitter current may be 10,000 times larger than the input base current. The output current flows through resistive network 80 producing voltage drops across resistors 88 and 90. Thus a small current flowing into node 72 can control the output voltage at terminal 18.

Amplifier 10 utilizes negative feedback to keep the emitter currents of transistors 22 and 24 equal or stabilized. For example, if the magnitude of the emitter current of transistor 30 undesirably increases, then its collector current increases which provides base drive for transistor 56. The resulting increased collector current of transistor 56 causes current amplifier 70 to provide a current of increased magnitude through resistor 88 and 90. The increased potential at node 78 causes a current to flow through resistor 84 to provide additional base drive to transistor 24. Consequently, transistor 24 is rendered more conductive than transistor 22 which tends to reduce the portion of the current from current source 28 that is available to flow through transistor 22. Thus, the emitter current of transistor 22 is returned to its desired magnitude.

Similarly, if the magnitude of the current of transistor 24 tends to undesirably increase, the emitter current of transistor 22 must decrease since current supply 28 provides a constant current, assuming a constant temperature. As a result, the base drive for transistor 56 is reduced which causes the collector current thereof to diminish in magnitude. Consequently, current amplifier 70 provides less current across resistors 88 and 90 thereby reducing the potential at node 78. Thus, the base drive provided through resisitor 84 to transistor 24 is reduced to cause the emitter current of transistor 24 to return to its desired magnitude. The negative feedback operation also tends to compensate for undesired decreases in the magnitude of the emitter currents of transistors 22 and 24.

The voltage differential $\Delta V$ results in a predictable, temperature stable quiescent input offset voltage. The resistances of resistors 82 and 84 are chosen to have equal values. Since the base-to-emitter drop of transistor 24 plus the voltage drop across resistor 84 is approximately equal to the base-to-emitter drop of transistor 22 plus the voltage drop across resistor 82, the voltage differential, $\Delta V$ developed across resistor 26 also appears across resistor 88. Because of the high voltage and current gains of amplifiers 20 and 70 respectively, a very small difference in the base voltage of transistors 22 and 24 can cause a large voltage across resistor 88. Thus, the voltage established across resistor 88 tends to be almost equal to the offset voltage $\Delta V$. As a result, the quiescent output voltage at output terminal 18 of amplifier 10 tends to have a constant magnitude with temperature change. The quiescent output voltage, $V_{oq}$ is expressed as follows:

$$V_{oq} = \Delta V(1 + \frac{R_{90}}{R_{88}})$$

Thus, amplifier 10 can generate input and output quiescent voltages that remain substantially constant with temperature change. Moreover, the quiescent voltages remain constant between the circuits of different batches of integrated circuit wafers. Thus, tests which monitor these quiescent voltages and the design of driver and output circuits for amplifier 10 can be more readily engineered than if these voltages varied. Alternatively, since the output quiescent voltage varies with $\Delta V$, if $\Delta V$ is designed to have a particular temperature coefficient, $V_{oq}$ will also have that particular temperature coefficient which could be utilized to compensate an unwanted temperature coefficient of a circuit driven by amplifier 10, for instance.

DYNAMIC OPERATION

Assume that a sinusoidal input signal is generated by transducer 12 and applied through coupling capacitor 14 to input terminal 16 of amplifier 10. As the input signal swings in a positive direction, transistor 22 will be rendered more conductive than transistor 24. As a result, transistor 56 will be rendered more conductive thereby supplying more current to transistors 74 and 76. Consequently, more current will be delivered to the load connected to amplifier output terminal 18, which may be a subsequent active stage included in the same monolithic integrated circuit structure as amplifier 10. Since resistor 88 is chosen to have a relatively small rsistance as compared to the resistance of resistor 90, a large portion of the positive going output signal will be fed back through bias resistor 82 in phase with the input signal.

Alternatively, as the sinusoidal input signal swings in the negative direction, transistor 22 is rendered less conductive than transistor 24 thereby decreasing the current drive from transistor 56. As a result, transistors 74 and 76 of current amplifier 70 are also rendered less conductive to decrease the output voltage across a load connected to output terminal 18 of amplifier 10. The relatively negative portion of the output voltage is also fed back in phase with the input signal through bias resistor 82 to input terminal 16. The combination of differential transistor 22 and 24, and differential-to-single ended converter circuit 52 provide a high voltage gain. Current amplifier 70 provides a high current gain. Thus, the power gain of amplifier 10 is substantial.

The input path in parallel with resistor 82 provides a high input impedance which can be neglected. Thus, the path including resistor 82 determines the amplifier input impedance. As a consequence of the positive feedback only a small fraction of the input voltage is developed across resistor 82. Therefore, only a small amount of current flows through resistor 82. Consequently, the impedance provided by the path including resistor 82 has a large magnitude. The input impedance, ($Z_{IN}$) of amplifier 10 is approximated by the following formula.

$$Z_{IN} = (1 + \frac{R_{90}}{R_{88}}) R82$$

Hence, the magnitude of the resistance of resistor 90 ($R_{90}$) should be large with respect to the magnitude of the resistance of resistor 88 ($R_{88}$). Of course, the magnitudes of the resistances of the resistors 88, 90 and 82 must be selected to provide the proper quiescent input bias level for transistor 22. Even thouggh resistor 82 may have a value of about 20K, the effective input impedance looking into amplifier 10 may be on the order of 4 megohms. Thus, amplifier 10 provides dynamic input impedance of a large magnitude using only resistive and bipolar semiconductor devices. Since a bootstrap capacitor is not required, the disadvantages associated therewith are eliminated.

Frequency stability criteria must be carefully considered in feedback type amplifiers so that oscillation is avoided. Most feedback amplifiers include a frequency compensation capacitor which tends to lower the gain of the amplifier at high frequencies to avoid high frequency oscillation. Some monolithic prior art amplifiers require a frequency compensation capacitor on the order of 5 picofarads which must be connected from a high voltage point to a ground or reference connector. Such high voltage capacitors when provided in monolithic form are generally constructed with materials having a low capacity per unit area. Thus, such capacitors tend to take up large amounts of valuable monolithic surface area. Moreover, such prior art capacitors sometimes require a separate isolation region and approximately 20 square mils of monolithic integrated circuit surface area.

The configuration of amplifier 10 of FIG. 1 enables advantage to be taken of the amplifier so that the compensation capacitor thereof can have a smaller value and hence take up less surface area than prior art configurations. Capacitor 68 is connected between the base and collector electrodes of transistor 24. As a result, advantage is taken of the high voltage gain of amplifier 20 combined with the differential-to-single ended converted circuit 53 to multiply the value of capacitor 58 by the well known Miller effect so that it has an apparent capacitance that is much higher than it actual capacitance. Thus, capacitor 68 can have a value of only about picofarad and still provide the dominant pole required for a stable closed loop system. Since capacitor 68 can have a low value because of the configuration of amplifier 10 and because it has a small voltage magnitude across it (about 1.4 volts), it can be manufactured as part of the collector base structure of transistor 24. In particular, the base region of transistor 24 can form the low voltage plate and an N+ emitter diffusion used in the collector of transistor 24 can form the other plate of capacitor 68. As a result capacitor 68 does not require any additional monolithic chip area or an isolation region.

The values of the passive components of the circuit of FIG. 1, which have been found suitable for use in a commercial embodiment of the invention, are as follows:

Resistor 26 3.6 Kilohm
Resistor 32 10K
Resistor 38 630 ohm
Resistor 40 3 Kilohm
Resistor 50 13 Kilohm
Resistor 82 25 Kilohm
Resistor 84 25 Kilohm
Resistor 88 12 ohms
Resistor 90 1.6 Kilohm A high impedance amplifier 10, which is suitable for being provided in monolithic integrated circuit form has been described. The amplifier does not require a positive feedback bootstrapping capacitor. Moreover, the configuration of amplifier 10 utilizes negative feedback to provide quiescent output and input voltages having controlled temperture characteristics. A current having a predetermined temperature characteristic is developed to compensate for the temperature characteristic of resistor 26, to create a voltage for supplying the quiescent output voltage. Moreover, the differential-to-single ended converter circuit 53 is configured so that the collector currents of transistors 22 and 24 are not, on a first order, dependent on the betas of lateral PNP transistors 56 and 58 which tend to changefrom batch to batch because of uncontrolled processing parameters. The amplifier configuration of FIG. 1 enables utilization of the Miller effect to multiply the capacitance of capacitor 68. The configuration of amplifier 10 of FIG. 1 is relatively simple and inexpensive as compared to any other prior art circuit known of by the inventor at this time.

Although the invention has been described with reference to a particular emobodiment, it is to be understood that this embodiment is merely illustrative of the application of the principles of the invention. Numerous modifications may be made therein and other arrangements may be devised without departing from the spirit and scope of the invention.

I claim:

1. A high input impedance amplifier having a quiescent output voltage with a predetermined temperature coefficient including in combination:
    differential amplifier means including first and second electron control devices, each having a control electrode and first and second main electrodes, said differential amplifier means further having a first input terminal, a second input terminal and an output terminal;
    offset voltage supply means coupled between said first main electrodes of said first and second electron control devices, said offset voltage supply means causing an offset voltage to be developed between said control electrodes of said first and second electron control devices having a selected temperature coefficient;
    feedback means coupled between said control electrode of said second electron control device, said output terminal of said differential amplifier means and the output terminal of the high input impedance amplifier; and
    bias means connected between said feedback means and said control electrode of said first electron control device for providing a positive feedback path for increasing the input impedance at said control electrode of said first electron control device, said bias means and said feedback means being responsive to said offset voltage to provide the quiescent voltage having said predetermined temperature coefficient at the output terminal of the high input impedance amplifier.

2. The amplifier circuit of claim 1 wherein:
    said feedback means further has first resistive means and second resistive means, said first resistive means being connected between said control electrode of said second electron control device and the output terminal of the high input impedance amplifier, and said second resistive means being connected between the output terminal of the high input impedance amplifier and one end of said bias means; and
    said first resistive means and said bias means having resistances of approximately the same magnitude so that said offset voltage is developed across said second resistive means to provide the quiescent output voltage at the output terminal of the high input impedance amplifier circuit having the predetermined temperature coefficient.

3. The amplifier circuit of claim 2 wherein said feedback means further includes third resistive means coupled between said one end of said bias means and a reference potential conductor.

4. The amplifier circuit of claim 1 wherein said predetermined temperature coefficient is zero.

5. The amplifier circuit of claim 2 wherein: said offset voltage means further includes a current supply means which provides a current having a desired temperature coefficient.

6. The amplifier circuit of claim 5 wherein said offset voltage supply means includes a third resistive means having a predetermined resistive temperature coefficient and said current supply means, includes:
    a third electron control device having a first predetermined voltage temperature coefficient;
    further amplifier means coupled to said third electron control means for increasing said first predetermined voltage temperature coefficient to provide a second predetermined voltage temperature coefficient;
    a fourth electron control device having said second predetermined voltage temperature coefficient coupled to said further amplifier means so that said fourth electron control device provides a voltage which has a zero temperature coefficient; and
    fourth resistive means coupled to said fourth electron control device for generating a current having a predetermined current temperature coefficient opposite to but of substantially equal magnitude to said predetermined resistive temperature coefficient of said third resistive means so that said third resistive means develops said offset voltage.

7. The amplifier circuit of claim 1, further including:
    capacitance means connected between said control electrode of said second electron control device and said output terminal of said differential amplifier means;
    said differential amplifier means further including voltage amplifier means which increases the apparent capacitance of said capacitance means at said control electrode of said second electron control device to provide frequency stabilization of the high input impedance amplifier circuit.

8. The amplifier circuit of claim 1 wherein said differential amplifier means further includes a differential-to-single ended converter circuit means having:
    a first bipolar transistor device with an emitter electrode connected to receive a first power supply potential, a first electrode connected to said second main electrode of said first electron control device, a second collector electrode, and a base electrode connected to said second collector electrode thereof; and
    a second bipolar transistor device having an emitter electrode connected to said base electrode of said first bipolar transistor device, a base electrode connected to said first collector electrode of said first bipolar transistor device, and a collector electrode connected to said second main electrode of said second electron control device.

9. The amplifier circuit of claim 1 further including current amplifier means having Darlington transistor means connected between said second main electrode of said second electron control device and the output terminal of the high input impedance amplifier.

10. A bipolar transistor amplifier which is suitable for fabrication in integrated circuit form and for providing a stable quiescent direct current output voltage at an output terminal thereof having a substantially zero temperature coefficient, including in combination:
    first bipolar transistor means having emitter, base and collector electrodes;
    second bipolar transistor means having emitter base and collector electrodes;

first resistive means coupling said emitter electrode of said first transistor means to said emitter electrode of said second transistor means, said first resistive means having a resistive temperature coefficient;

current supply means coupled to said first resistive means, said current supply means providing a current through said first resistive means which has a current temperature coefficient of substantially equal magnitude but of opposite direction to said resistive temperature coefficient so that said first resistive means develops a predetermined potential difference thereacross which has a magnitude that remains substantially constant with temperature change so that a temperature stable offset voltage is developed between said base electrodes of said first and second bipolar transistor means; and resistive network means coupling said base electrodes of said first and second bipolar transistor means to the output terminal of the bipolar transistor amplifier to provide the quiescent output voltage that remains constant with temperture variation.

11. The amplifier circuit of claim 10 further including a frequency compensating capacitor connected between said base and collector electrodes of said second bipolar transistor means.

12. The amplifier circuit of claim 10 further including Darlington connected transistors connected between said collector electrode of said second bipolar transistor means and the output terminal of the high impedance amplifier.

13. The amplifier circuit of claim 10 wherein said resistive network means includes:

a second resistive means for providing negative feedback to stabilize the quiescent voltages of said first and second bipolar transistor means, said second resistive means being connected between said base electrode of said second bipolar transistor and the output terminal of the bipolar transistor amplifier;

third resistive means connected to the output terminal of the bipolar transistor amplifier; and fourth resistive means connected between said third resistive means and said base electrode of said first bipolar transistor means, said second and fourth resistive means having resistances of approximately equal magnitude so that said predetermined potential difference developed across said first resistive means is developed across said third resistive means.

14. The amplifier circuit of claim 13 further including a fifth resistive means connected between said third resistive means and a reference potential conductor.

15. The amplifier circuit of claim 10 wherein said current supply means includes:

voltage supply means for providing a voltage which has a zero temperature coefficient;

further resistive means connected to said voltage supply means and having a temperature coefficient identical to said temperature coefficient of said first resistive means so that said further resistive means conducts a current which increases in magnitude as the resistance of said first resistive means decreases and which decreases in magnitude as said resistance of said first resisitive means increases in magnitude; and means coupling said current to said first resistive means to develop said predetermined potential difference thereacross which has a magnitude that is substantially constant with temperature change.

16. An amplifier including in combination:

differential amplifier means including first and second electron control means, each having a control electrode and first and second main electrodes, said differential amplifier means having a first input terminal, a second input terminal and an output terminal;

first resistive means for providing a temperature stable offset voltage and for coupling said first main electrodes of said first and second electron control devices together, said first resistive means having a predetermined resistive temperature coefficient; and current supply means for providing a current which has a temperature coefficient that substantially cancels the temperature coefficient of said first resistive means, said current supply means including a third electron control device having a first predetermined voltage temperature coefficient, further amplifier means coupled to said third electron control means and being responsive to said first predetermined voltage temperature coefficient to provide a second predetermined voltage temperature coefficient, a fourth electron control device having said second predetermined voltage temperature coefficient coupled to said further amplifier means so that said fourth electron control device provides a voltage which has a zero temperature coefficient and second resistive means coupled to said fourth electron control device for generating said current having the predetermined current temperature coefficient opposite to but of substantially equal magnitude to said predetermined resistive temperature coefficient of said first resistive means so that said temperature stable offset voltage is developed across said first resistive means.

* * * * *